US012738851B2

(12) United States Patent
Amidon et al.

(10) Patent No.: US 12,738,851 B2
(45) Date of Patent: Sep. 15, 2026

(54) ACTIVE RECTIFICATION CIRCUITRY

(71) Applicant: TEXAS INSTRUMENTS INCORPORATED, Dallas, TX (US)

(72) Inventors: Gregory Amidon, Indianapolis, IN (US); Isaac Cohen, Dix Hills, NY (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/514,509

(22) Filed: Nov. 20, 2023

(65) Prior Publication Data

US 2024/0372474 A1 Nov. 7, 2024

Related U.S. Application Data

(60) Provisional application No. 63/463,109, filed on May 1, 2023.

(51) Int. Cl.
*H02M 3/158* (2006.01)
*H03K 17/30* (2006.01)
*H03K 19/0185* (2006.01)

(52) U.S. Cl.
CPC ........ *H02M 3/1588* (2013.01); *H03K 17/302* (2013.01); *H03K 19/018507* (2013.01)

(58) Field of Classification Search
CPC .............. H02M 3/1588; H03K 17/302; H03K 19/018507
See application file for complete search history.

(56) References Cited

U.S. PATENT DOCUMENTS 10,298,118 B1 5/2019 Nam
2011/0025278 A1* 2/2011 Balakrishnan .......... H02M 1/32 320/166
2016/0301306 A1* 10/2016 Jiang ....................... H02M 1/44
2020/0136494 A1* 4/2020 Kazama ................ H02M 3/158

* cited by examiner

*Primary Examiner* — Rafael O Leon De Domenech
(74) *Attorney, Agent, or Firm* — Charles F. Koch

(57) ABSTRACT

An example circuit includes a first transistor and a second transistor coupled in series with the first transistor. A regulator circuit is configured to regulate a voltage across the second transistor based on a first reference voltage and a voltage at a node between the first and second transistors. A rectification drive circuit is configured to operate the first and second transistors in a rectification mode based on a voltage at the node and at least one second reference voltage.

22 Claims, 5 Drawing Sheets

ACTIVE RECTIFICATION CIRCUITRY

CROSS-REFERENCE TO RELATED APPLICATION

This application claims priority to U.S. provisional patent application No. 63/463,109, filed May 1, 2023, which is incorporated herein by reference in its entirety.

TECHNICAL FIELD

This description relates to electrical circuits, in particular, circuitry configured to implement active rectification.

BACKGROUND

Active rectification (also referred to as synchronous rectification) relates to a rectification technique that uses actively controlled switches, such as power transistors, instead of passive diodes. Active rectification has many applications, including in bidirectional power converter circuits. If the timing for controlling switches during activation rectification is not accurately controlled efficiency is reduced by prolonged body diode conduction or shoot-through can occur that can reduce efficiency or damage system components.

SUMMARY

One example relates to a circuit that includes a transistor having first and second current terminals and a control terminal. A sensing circuit has first and second sense terminals, in which the first sense terminal is coupled to the second current terminal. A logic circuit has first and second logic inputs and a logic output, in which the logic output is coupled to the control terminal. A first comparator has first and second comparator inputs and a first comparator output, in which the first comparator output is coupled to the first logic input. The first comparator input is coupled to the second current terminal, and the second comparator input is coupled to a first reference voltage terminal. A second comparator has third and fourth comparator inputs and a second comparator output, in which the second comparator output is coupled to the second logic input. The third comparator input is coupled to the second current terminal, and the fourth comparator input is coupled to a second reference voltage terminal.

Another example relates to a circuit that includes a first transistor having first and second current terminals and a first control terminal. A second transistor has third and fourth current terminals and a second control terminal, and the third current terminal is coupled to the second current terminal. A regulator circuit has first and second regulator inputs and a regulator output, in which the regulator output is coupled to the second control terminal. The first regulator input is coupled to the second current terminal, and the second regulator input is coupled to the first control terminal. A rectification drive circuit has a sense input and a drive output, in which the sense input is coupled to the second current terminal and the drive output is coupled to the first control terminal and the second regulator input.

Another example includes an example circuit includes a first transistor and a second transistor coupled in series with the first transistor. A regulator circuit is configured to regulate a voltage across the second transistor based on a first reference voltage and a voltage at a node between the first and second transistors. A rectification drive circuit is configured to operate the first and second transistors in a rectification mode based on a voltage at the node and at least one second reference voltage.

DETAILED DESCRIPTION

This description relates generally to electronic circuits, and more particularly to circuits and systems configured to implement active rectification, such as for bi-directional power converters.

As an example, a circuit includes a first transistor coupled in series with a sensing circuit. The first transistor can be a power transistor. The sensing circuit is configured to provide a voltage at a node between the first transistor and the sensing circuit. In an example, the sensing circuit includes a resistor device (e.g., one or more solid state resistors) configured to provide the voltage at the node between the first transistor and the sensing circuit based on current through the resistor. In another example, the sensing circuit includes a second transistor, which is in series with the first transistor, and a regulator circuit. The regulator circuit can be configured to regulate a voltage across the second transistor circuit based on a first reference voltage and the voltage at the node between the first transistor and the sensing circuit based on current through the resistor. For example, the regulator circuit includes a transistor (e.g., a field effect transistor (FET)) that is controlled to provide a substantially constant voltage across the transistor or a decreasing voltage based on system current. The circuit also includes a rectification drive circuit configured to operate the first transistor in a rectification mode based on the voltage at the node and one or more other reference voltages.

In some examples, as described herein, the circuit can further include logic to enable the circuit to operate in a power conversion mode or in the rectification mode. In the power conversion mode, the circuit is configured to convert an input voltage to an output voltage based on current that can flow in a direction from the first transistor to the sensing circuit. In the rectification mode, the circuit is configured to enable current to flow in a direction from the sensing circuit to the first transistor. In a further example, an instance of the active rectification circuit can be configured to provide active rectification for each respective branch of a bridge circuit (e.g., a half-bridge or full-bridge circuit). As described herein, the rectification can be controlled automatically based on a measure of current through a respective sensing circuit, which is coupled in series with the power transistor of the branch. The automatic control is further configured to inhibit shoot-through by ensuring that the active rectification is disabled before an opposite switching component (e.g., power transistor) is enabled. As a result, the power loss associated with the rectification can be reduced and provide for more efficient circuit operation while avoiding cross conduction due to one half of the bridge being commanded to conduct while automatic rectification is active.

Figure 1:
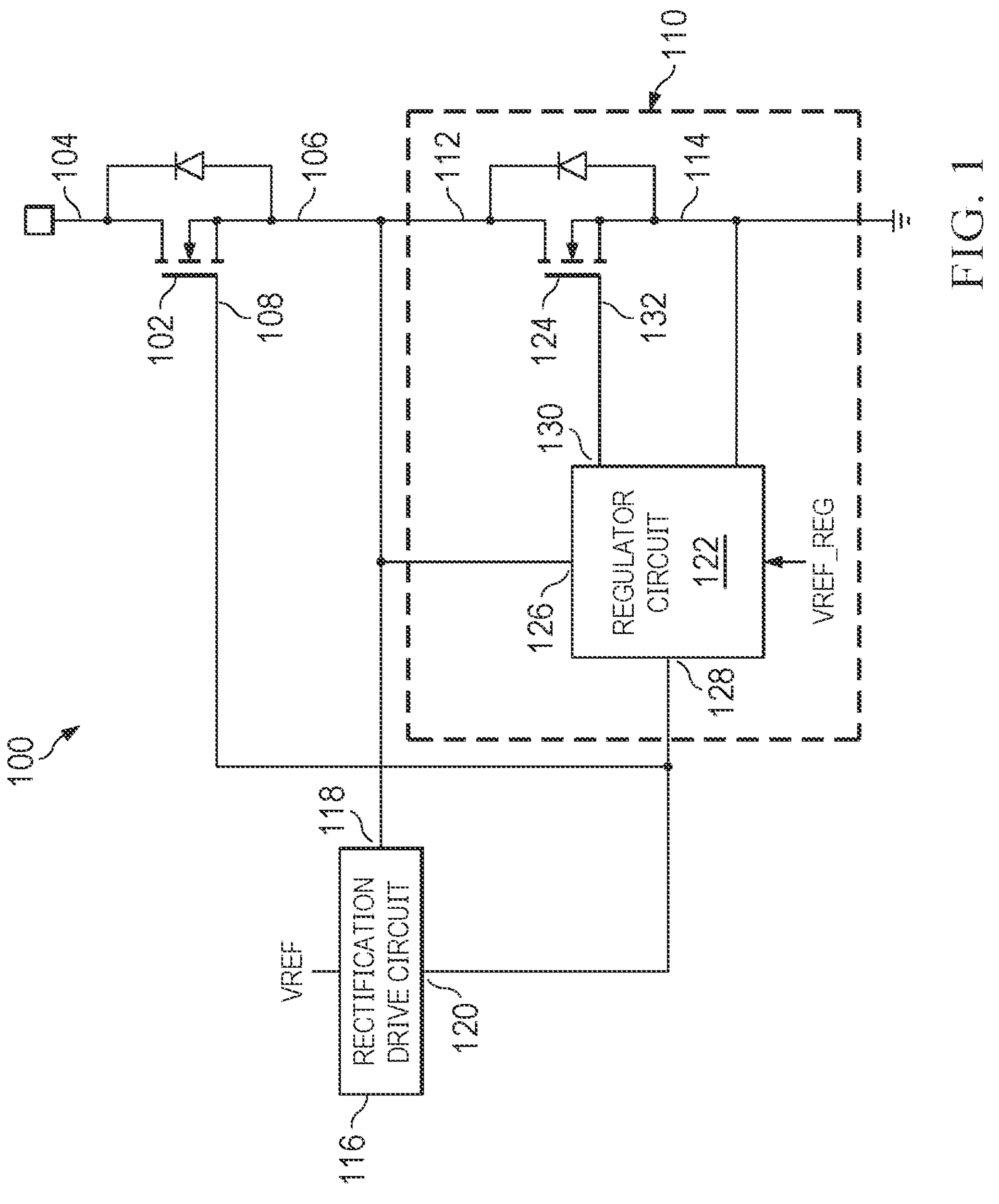
FIG. 1 is a schematic diagram of an example active rectification circuit.

FIG. 1 is a block diagram of an active rectification circuit 100. The circuit 100 includes a transistor 102 having a first current terminal (e.g., a drain) 104, a second current terminal (e.g., source) 106, and a control terminal (e.g., a gate) 108. The transistor 102 can be implemented as a high-voltage power transistor, such as gallium nitride (GaN), or silicon carbide (SiC) power field effect transistor (FET). Other types of transistors can be used to implement the transistor 102 in other examples, such as a bipolar junction transistor (BJT) or an insulated gate bipolar transistor (IGBT). In an example, the current terminal 104 of the transistor 102 is coupled to a high voltage terminal, such as corresponding to an output voltage terminal of a power supply or battery, which has a voltage greater than about 200 V, such as 1000 V or even greater.

The circuit 100 also includes a sensing circuit 110 having first and second sense terminals 112 and 114, in which the first sense terminal 112 is coupled to the second current terminal 106. The sense terminal 114 can be coupled to a ground terminal, as shown, or to another terminal of a power converter circuit. The circuit 100 also includes a synchronous rectification (SR) drive circuit (also referred to as a rectification or SR drive circuit) 116. The drive circuit 116 has a sense input 118 coupled to the second current terminal 106 and a drive output 120 coupled to the control terminal 108.

In the example of FIG. 1, the sensing circuit 110 includes a regulator circuit 122 and a transistor 124. The regulator circuit 122 has first and second regulator inputs 126 and 128 and a regulator output 130. The first regulator input 126 is coupled to the second current terminal 106 and the second regulator input 128 is coupled to the first control terminal 108. The regulator output 130 is coupled to a control terminal (e.g., gate) 132 of the transistor 124. The transistor 124 also has a first current terminal (e.g., drain) coupled to first sense terminal 112 and a second current terminal 136 coupled to the second sense terminal 114. In an example, the circuit 100 is implemented as an integrated circuit (IC), in which the IC includes the sensing circuit 110 and the rectification drive circuit 116. The IC can further include an output terminal coupled to the output 120 of the rectification drive circuit 116 to which the control terminal of the transistor can be coupled. The transistors 102 and/or 124 can be implemented within the IC or external to the IC.

The regulator circuit 122 is configured to regulate a voltage across the second transistor 124 based on a reference voltage (e.g., VREF_REG) and a voltage at the second current terminal 106 (e.g., at a node between the transistor 102 and the sensing circuit 110) to which the regulator input 126 is coupled. The rectification drive circuit 116 is configured to provide a control signal at 120 to drive the first and second transistors 102 and 124 in a rectification mode based on a voltage at the second current terminal 106 and at least one reference voltage (e.g., VREF). In the rectification mode, the regulator circuit 122 is configured to regulate a voltage across the transistor 124 to a substantially constant voltage, such as for example, less than 1V (e.g., less than 50 mV, or about 10 mV).

Figure 2:
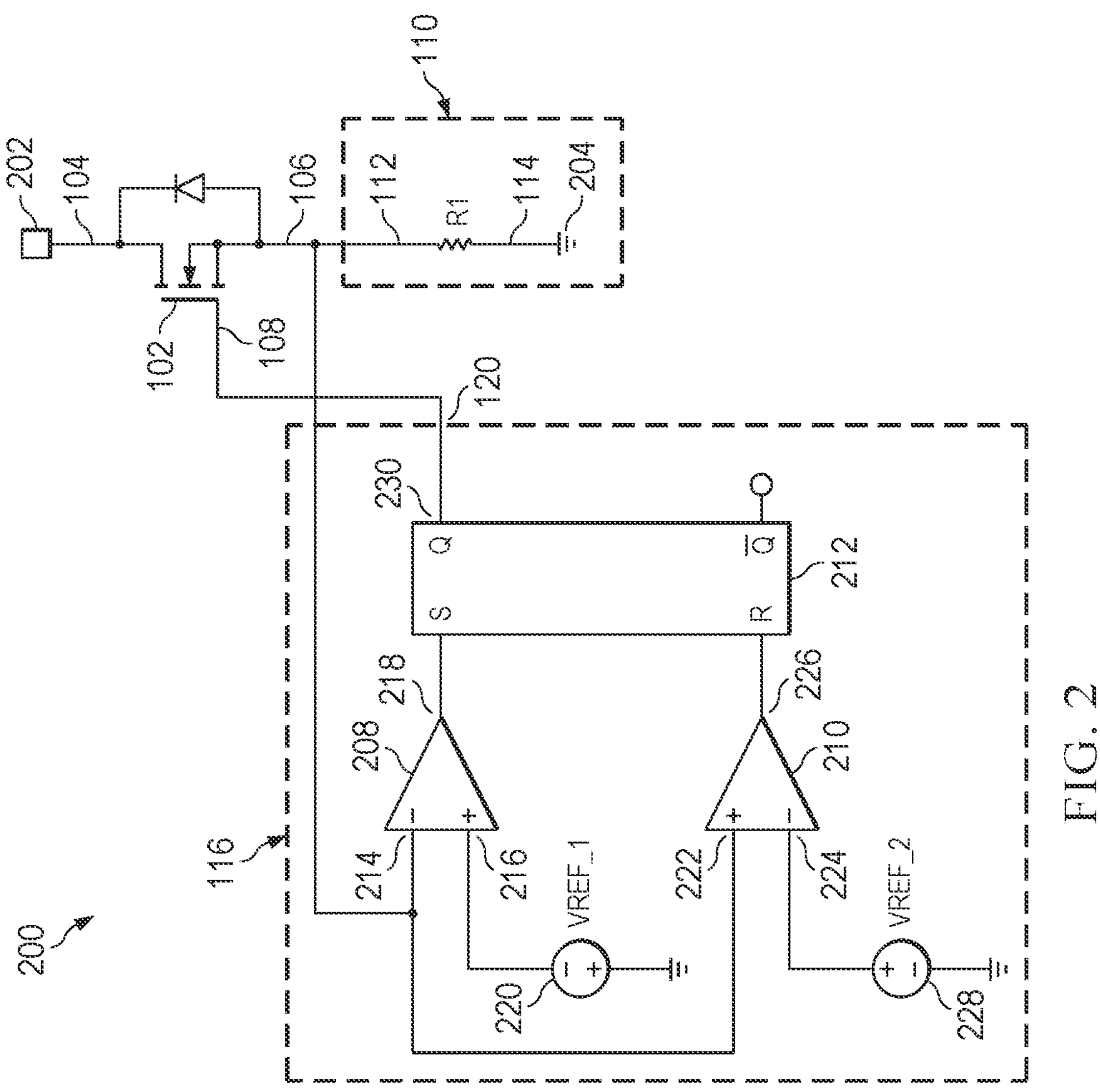
FIG. 2 is a circuit diagram of an example active rectification circuit.

FIG. 2 is an example of another rectification circuit 200. The rectification circuit 200 can be used to implement the circuit 100 of FIG. 1. Accordingly, the description of FIG. 2 may also refer to the description of the example circuit 100 of FIG. 1. The rectification circuit 200 includes a transistor 102 in series with a sensing circuit 110 between respective terminals, shown as a voltage terminal 202 and a ground terminal 204. The transistor 102 has a first current terminal (e.g., a drain) 104 coupled to the voltage terminal 202 and a second current terminal (e.g., a source) 106 coupled to a respective terminal 112 of the sensing circuit 110.

In the example of FIG. 2, the sensing circuit 110 includes a resistor R1 having a first sense terminal coupled to the second current terminal 106 and a second sense terminal coupled to the ground terminal 204. In other examples, different types and configurations of sensing circuits can be used. The resistor R1 can be a sense resistor configured to provide a voltage at 112 representative of current through the resistor R1. The resistor R1 can be configured with a resistance set according to expected current through the circuit. In an example where the expected current is about 20 A, resistor R1 can have a resistance in a range from about 2 mΩ to about 5 mΩ. The resistor R1 can have other resistance values in other examples.

The circuit 200 also includes a rectification drive circuit 116 having an input coupled to the sense terminal 112 (also coupled to the second current terminal 106). The rectification drive circuit 116 also has an output coupled to a control input (e.g., gate) of the transistor 102. The rectification drive circuit 116 is configured to control the transistor 102 in a rectification mode, to conduct current from the sensing circuit to the voltage terminal based on the voltage at 112.

In the example of FIG. 2, the rectification drive circuit 116 includes a first comparator 208, a second comparator 210 and a logic circuit 212. The first comparator 208 has first and second comparator inputs 214, 216 and a comparator output 218. The first comparator input 214 is coupled to the second current terminal 106 (also coupled to the sense terminal 112). The second comparator input 216 is coupled to a first reference voltage terminal, which can be coupled to a DC voltage source 220 configured to provide a first reference voltage (VREF_1). The first comparator output 218 is coupled to an input of the logic circuit. The first comparator 208 is configured to provide a comparator signal at 218 based on the voltage at 106, 112 relative to first reference voltage VREF_1 at 216.

Similarly, the second comparator 210 has comparator inputs 222 and 224 and a comparator output 226. The comparator input 222 is coupled to the second current terminal 106 (also coupled to the sense terminal 112). The other comparator input 224 is coupled to a second reference voltage terminal, which can be coupled to a DC voltage source 228 configured to provide a second reference voltage (VREF_2). The comparator output 226 is coupled to another input of the logic circuit 212. The second comparator 226 is configured to provide a comparator signal at 226 based on the voltage at 106, 112 relative to the second reference voltage VREF_2 at 224. For example, VREF_1 is greater than VREF_2.

The logic circuit 212 has an output 230 coupled to the drive output 120, which is coupled to the control terminal 108 of the transistor 102. The logic circuit 212 is configured to provide a logic output signal (e.g., a logic high or logic low) at output 230, which is provided to the control terminal 108, based on the first and second comparator output signals at 218 and 226, respectively. For example, the logic circuit 212 is a flip-flop device (e.g., a set-reset (SR) flip-flop) that provides a logic high output if the voltage at 106, 112 exceeds VREF_1 and a logic low if the voltage falls below VREF_2. Thus, the rectification drive circuit 116 is configured to turn on the transistor 102 in the rectification mode responsive to the voltage across the resistor R1 exceeding VREF_1 and to turn off the transistor 102 responsive to the voltage across R1 dropping below VREF_2. In an example, VREF_1 is approximately 1V and VREF_2 is approximately 0.5V. Other respective voltage values can be used in other examples. By using two comparators 208 and 210 in this way, the rectification drive exhibits hysteresis to avoid instabilities arising from repetitive switching of the transistor 102 in the rectification mode. In some examples, a gate driver circuit (not shown) can be coupled between the output 230 and the control terminal 108. The gate driver circuit can be configured to provide an appropriate voltage and sufficiently high-current drive input to activate the power transistor 102 responsive to the logic output signal provided at 230 by the logic circuit 212.

In an example, the circuit 200 is implemented as an IC, which includes the resistor R1, the logic circuit 212, the first and second comparators 208 and 210. The IC can also include a gate drive terminal coupled to output 120 of the logic circuit 212. The transistor 102 can be implemented within the IC or be external to the IC, and the control terminal 108 can be coupled to the gate drive terminal of the IC. The sensing circuit 110 can be implemented within the IC or external to the IC.

Figure 3:
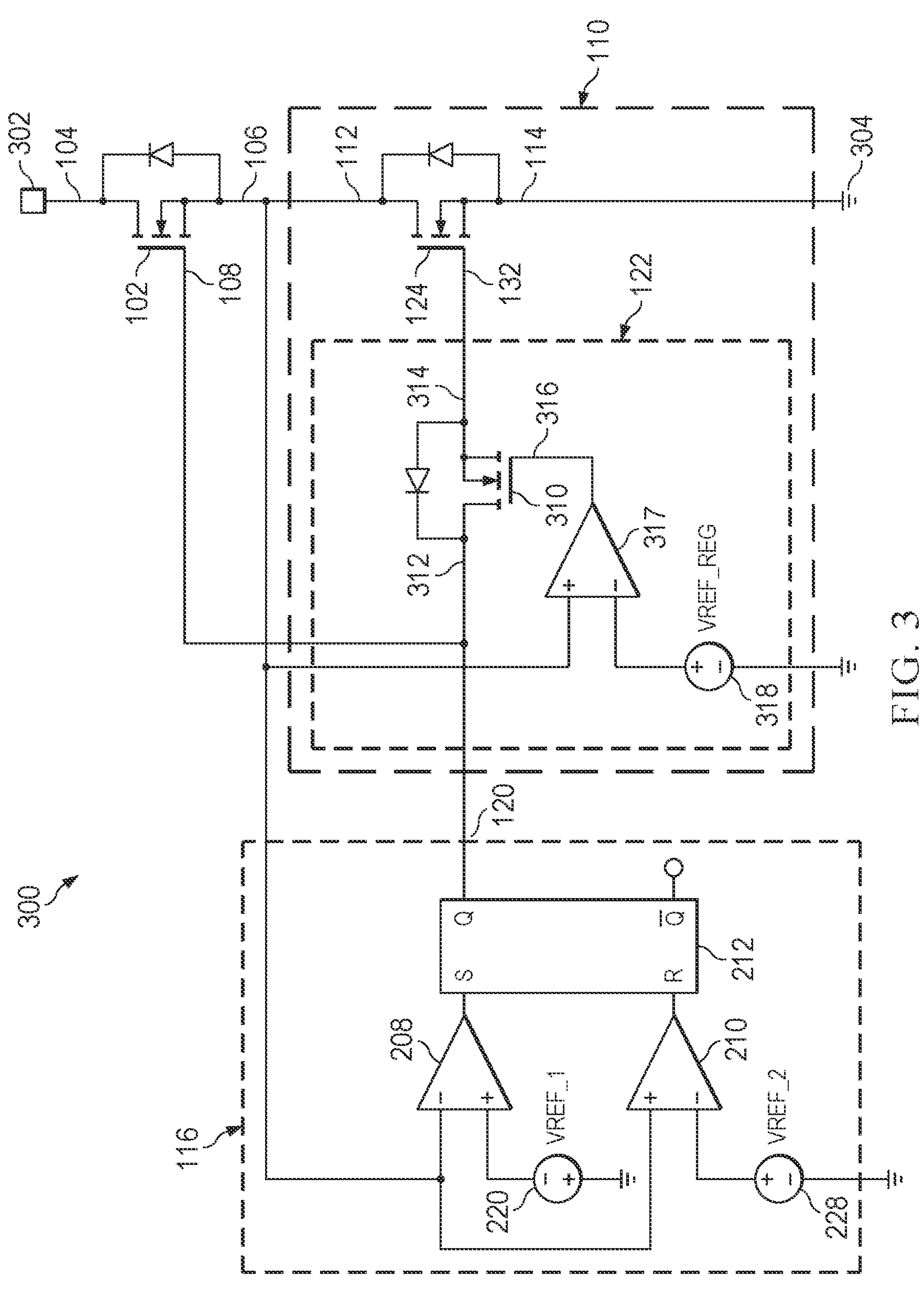
FIG. 3 is a circuit diagram of another example active rectification circuit.

FIG. 3 is an example of another rectification circuit 300. The rectification circuit 300 can be used to implement the circuit 100 of FIG. 1. Portions of the circuit 300 also can be the same as described with respect to FIG. 2. Accordingly, the description of FIG. 3 may also refer to the description of circuits of FIGS. 1 and 2. As described herein, the rectification circuit 300 includes a transistor 102 in series with a sensing circuit 110 between respective terminals, shown as a voltage terminal 302 and a ground terminal 304. The transistor 102 has a first current terminal (e.g., a drain) 104 coupled to the voltage terminal 202 and a second current terminal (e.g., a source) 106 coupled to a respective terminal 112 of the sensing circuit 110. The rectification circuit 300 also includes a rectification drive circuit 116, which is implemented the same as described with respect to FIG. 2.

Similar to the example of FIG. 1, the sensing circuit 110 includes a regulator circuit 122 and a transistor 124. The transistor 124 has a first current terminal (e.g., drain) coupled to first sense terminal 112 and a second current terminal 136 coupled to the second sense terminal 114. The transistor 124 can be a low voltage (e.g., rated for less than 20 V) MOSFET in series with the transistor 102 between the terminals 302 and 304. As an example, the FET 102 is rated to 650 V, 1,200 V or 1,700 V or more (or less) depending on the application, and the transistor 124 is rated for less than 20 V. The transistor 124 also can be designed to have a low RDSon (e.g., less than about 5 mΩ, or about 1 mΩ or less) so the voltage drop across the transistor 124 is low (e.g., virtually negligible) in both rectification and power conduction modes.

In the example of FIG. 3, the regulator circuit 122 includes a transistor 310 having respective current terminals 312 and 314 and a control terminal 316. One current terminal (e.g., a drain terminal) 312 is coupled to the logic output 230 and the other current terminal (e.g., a source terminal) 314 is coupled to the control terminal 132 of the transistor 124. The regulator circuit 122 also includes an error amplifier 317 having a first error input coupled to the second current terminal 106 of the transistor 102 and a second error input coupled to a regulation reference voltage terminal, which can be coupled a DC voltage source 318 configured to provide a reference voltage (VREF_REG). The reference voltage VREF_REG can be set to less than 1 V, such as less than about 20 mV (e.g., about 10 mV). The reference voltage VREF_REG can be set to other values according to application requirements. The regulator circuit 122 thus provides a closed loop control circuit that is configured to modulate a voltage at the control terminal (e.g., gate) of the transistor 306 to regulate the voltage across the transistor 124 to a constant voltage (e.g., a low voltage set by VREF_REG) during the conduction time of the rectification mode. In the example of FIG. 1, because the sensing element of the sensing circuit 110 is implemented using a FET 124 when the current lessons, the effective RDSon of the FET 124 increases, which enables reverse current to be identified more easily compared to other types of sensing elements. However, other sensing elements, such as a resistor, can be used in other examples.

In an example, the circuit 300 (or a portion thereof) can be implemented as an IC. The IC can include the sensing circuit 110 and the rectification drive circuit 116. The transistors 102 and/or 124 can be implemented within the IC or be external to the IC. If either or both transistors 102 and 124 are external to the IC, the IC can include one or more output terminals coupled to the control terminal of the respective transistors.

Figure 4:
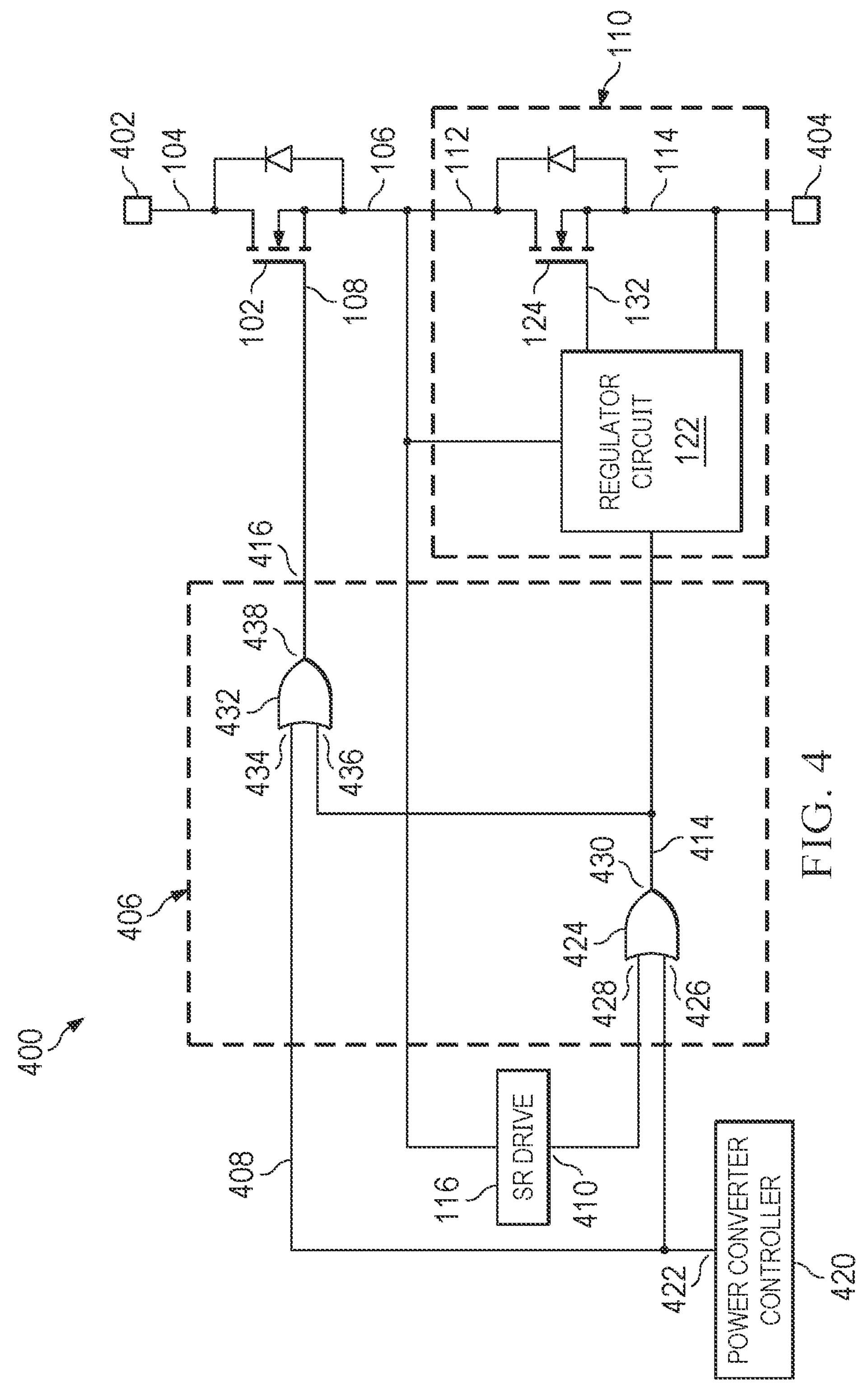
FIG. 4 is a diagram of an example bidirectional power converter circuit configured to implement active rectification.

FIG. 4 depicts an example of a bidirectional power converter circuit 400, which can include (or implement) an instance of the rectification circuits of FIG. 1, 2 or 3. Accordingly, the description of FIG. 4 may also refer to the descriptions of the example circuits of FIGS. 1, 2 and 3. The power converter circuit 400 includes a power transistor 102 coupled in series with a sensing circuit 110 between first and second terminals 402 and 404. In an example, the first terminal 402 is a high-side input voltage terminal that can be coupled to an input voltage (e.g., a voltage rail of the power converter circuit). The second terminal 404 can be coupled to a ground or switching node/terminal of the power converter circuit. In the example of FIG. 4, the sensing circuit 110 includes a regulator circuit 122 and a transistor 124 coupled between a current terminal (e.g., source terminal) of the transistor 102 and the terminal 404. As described herein, the regulator circuit can be configured to regulate a voltage drop across the transistor 124 during a rectification mode. The power converter circuit 400 also includes an SR drive circuit 116 configured to control the transistors 102 and 124 in a rectification mode based on the voltage at the node between transistors 102 and 124 (e.g., defined by terminals 106, 112). For example, the SR drive circuit 116 includes comparators 208, 210 and a logic circuit 212

The power converter circuit 400 includes a switching logic circuit 406 having logic inputs 408 and 410 and a logic outputs 414 and 416. The output (e.g., output 120, 230 shown in FIGS. 1-3) of the SR drive logic circuit 116 is coupled to the logic input 410. As described herein, the signal at the output of the SR drive logic circuit 116 is operative to operate the transistor 102 in the rectification mode. The logic output 416 is coupled to the first control terminal 108 of transistor 102, and the logic output 414 is coupled to the control terminal of the transistor 124.

The circuit 400 also includes a power converter control circuit (also referred to as a power converter controller or controller) 420 having a drive control output 422 coupled to the logic input 408. The power converter control circuit 420 is configured to provide a drive logic signal at the drive control output 422 for controlling the transistors 102 and 124 as part of the power converter circuit. For example, the drive logic signal at 422 can control (e.g., activate or deactivate) the transistors 102 and 124 in a power conversion mode, such as to implement buck converter, a boost converter, a buck-boost converter or another converter topology. The switching logic circuit 406 can be configured to logically combine the signals from the SR drive logic circuit 116 and the power converter control circuit 420 to control the transistors 102 and 124 in either the rectification mode or the power conversion mode.

In an example, a microcontroller and/or logic circuitry (not shown, but see, e.g., FIG. 5) can be configured to control in which mode the power converter circuit 400 operates (e.g., the power conversion or rectification mode). Also, in some examples, the power converter control circuit 420 can be isolated from the inputs of the logic circuit 406, such as through a galvanic isolation barrier (e.g., capacitors). Also, or as an alternative, the circuit 400 (or a portion thereof) can be implemented as an IC or a system on chip (SOC). The IC or SOC can include the sensing circuit 110 (e.g., the regulator circuit 122 and/or the transistor 124), the rectification drive circuit 116 and the logic circuit 406. The power transistor 102 can be implemented within the IC/SOC or be external to the IC/SOC. If either or both transistors 102 and 124 are external to the IC/SOC, the IC/SOC can include one or more output terminals to which the control terminal of the respective transistors can be coupled.

In the example of FIG. 4, the logic circuit 406 includes a first OR-gate 424 having first and second OR-inputs 426 and 428 and a respective OR-output 430. The OR-input 426 is coupled to the output 422 of the power converter control circuit 420. The other OR-input 428 is coupled to the input 410 of the logic circuit 406, which is also coupled to the output of the SR drive logic circuit 116. The output 430 of the OR-gate is coupled to the output 414 of the logic circuit 406, which is also coupled to the control input (e.g., gate) of the transistor 124 (e.g., through the voltage regulator 122). The logic circuit 406 also includes a second OR-gate 432 having OR-inputs 434 and 436 and an OR-output 438. The OR-input 434 is coupled to the input 408 of the logic circuit, which is coupled to the output 422 of the controller 420. The other OR-input 436 is coupled to output 430 of the OR-gate 424. The OR-output 438 is coupled to the control terminal (e.g., gate) of the transistor 102.

The OR-gates 424 and 432 of switching logic circuit 406 are thus configured to operate the transistor 102 in a power conversion mode responsive to a drive control signal provided at drive control output 422. The OR-gates 424 and 432 are also configured to operate the transistor 102 in a rectification mode responsive to the rectification control signal provided at the output 120 of the SR drive circuit 116 based on a voltage at the second current terminal and a reference voltage at the first reference voltage terminal. That is, when the output 422 of the controller 420 is low, the SR drive logic circuit 116 controls whether the respective transistors 102 and 124 are conducting current.

Figure 5:
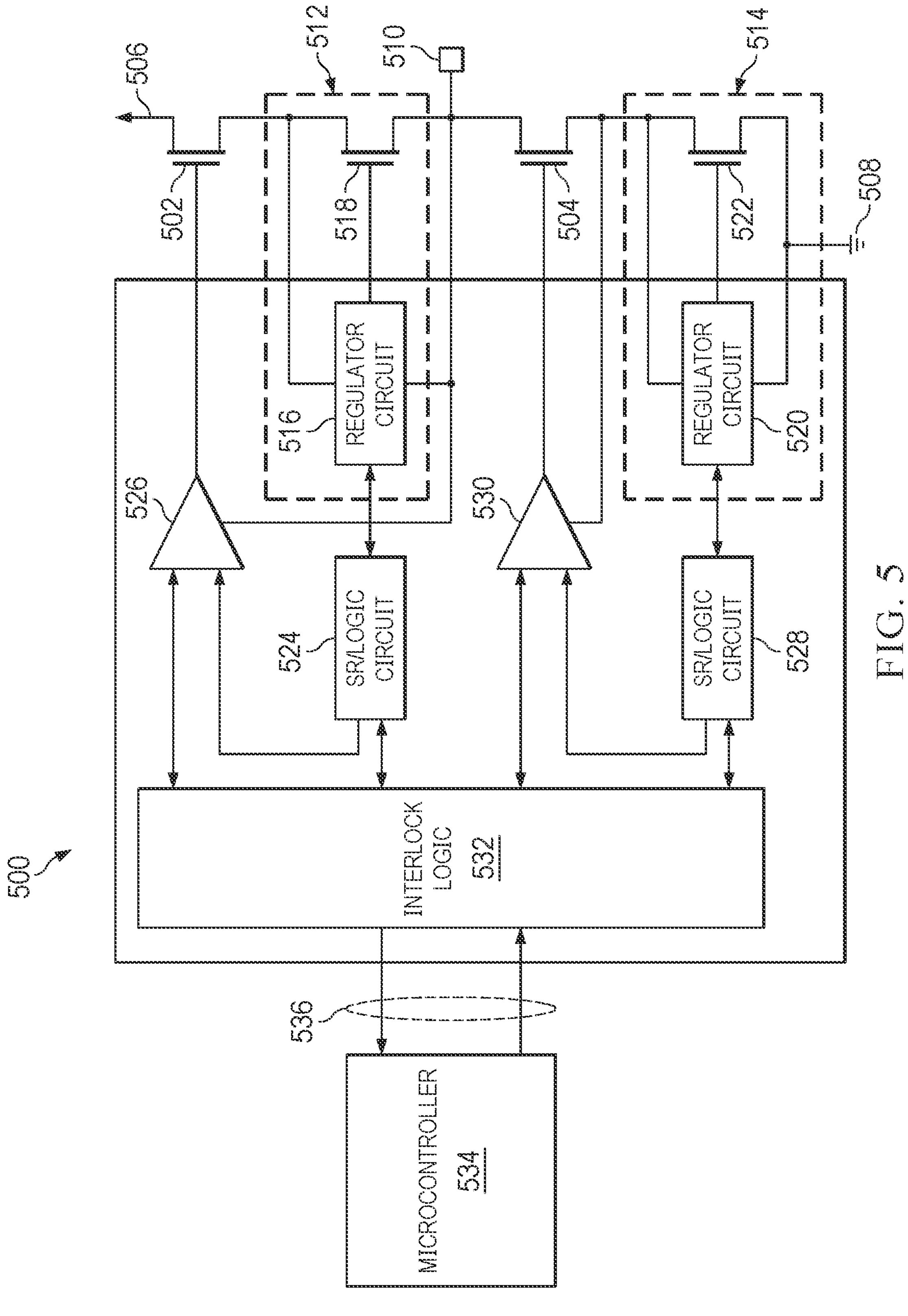
FIG. 5 is a circuit diagram of an example of a bidirectional power system.

FIG. 5 depicts an example of a bidirectional power converter circuit 500 that is configured to operate in power conversion mode and in an active rectification mode. The circuit 500 includes an output stage, implemented as a half-bridge, which includes a high-side power transistor 502 and a low-side transistor 504 coupled between an input voltage terminal 506 and a ground terminal 508. The circuit 500 also includes a switching terminal 510 at a node between the high-side and low-side transistors 502 and 504. A first sensing circuit 512 is coupled between the high-side transistor 502 and the switching terminal 510, and a second sensing circuit 514 is coupled between the low-side transistor 504 and the ground terminal. Each of the sensing circuits 512 and 514 can be implemented according to any of the examples of the sensing circuit 110, as described herein. A transformer and load circuitry can be coupled to the switching terminal.

In the example of FIG. 5, the first sensing circuit 512 includes a regulator circuit 516 and a transistor 518, and the second sensing circuit 514 includes a regulator circuit 520 and a transistor 522. Each regulator circuit 516, 520 can be an instance of the voltage regulator circuit 122 described herein (see, e.g., FIGS. 1 and 3). Each regulator circuit 516, 520 thus is configured to regulate the voltage across the respective transistor 518, 522, such as in closed loop manner during conduction of the respective transistor 502, 504.

The circuit 500 also includes high-side drive control circuitry and low-side drive control circuitry configured to control. In the example of FIG. 5, the high-side control circuitry includes an SR/logic circuit 524 and a high-side driver circuit 526. The low-side control circuitry also includes an SR/logic circuit 528 and a low-side driver circuit 530. Each SR/logic circuit 524 can be implemented as including an instance of SR drive circuit 116 and logic circuit 406 described herein (see, e.g., FIGS. 2 and 4). The SR/logic circuits 524, 528 thus are configured to provide control logic signals to operate the respective transistors 502, 504 in the power conversion mode or a rectification mode. In the example of FIG. 5, the SR/logic circuit 524 provides a high-side control logic signal to the high-side driver circuit 526, and the high-side driver circuit provides a drive signal to the gate of the transistor 502. Additionally, the SR/logic circuit 528 provides a low-side control logic signal to the low-side driver circuit 530, and the driver circuit 530 provides a corresponding low-side drive signal to the gate of the transistor 504.

The circuit 500 can also include an interlock logic circuit 532 and a microcontroller 534, which can communicate control and status information over a bidirectional communication channel (e.g., a bus) 536. The interlock logic circuit 532 can be coupled through respective communication links to each of the SR/logic circuit 524, 528 and the driver circuits 526, 530, such as for one-directional or bidirectional communication of control and/or status information. The interlock logic circuit 532 is configured to ensure that the high-side and low-side transistors 502 and 504 are not turned on concurrently. For example, the interlock logic circuit 532 is configured to disable activation of the high-side or low-side transistors 502, 504 and prevent shoot through (by providing control instructions to the SR/logic circuit 524, 528 and/or driver circuits 526, 530) until confirming that the opposite of the low-side or high-side transistors 504, 502 is fully disabled (e.g., turned off). The interlock logic circuit 532 can also be configured to delay activation of the respective transistors 502 and 504 in other circumstances. In some examples, the SR/logic circuits 524 and 528 can be configured to communicate feedback information specifying a current operating mode or an indication of a sensed voltage signal for the respective circuit 500. The interlock logic 532 is configured to control transition from commanded power conversion modes to automatic rectification mode and back, and therefore directly controls the behavior of the regulator circuits 516 and 520. Each of the regulator circuits 512 and 514 can thus receive feedback from its respective SR/logic circuit 524 and 528, such as can be provided from the microcontroller 534 or other circuitry to set the operating mode for the regulator circuits. For example, each regulator circuit 512, 514 can be commanded into a mode to either follow the respective FET 502, 504 or conduct at 100% during power conversion mode.

In the power conversion mode, high-side current flows from the terminal 506 through the transistor 502 and the sensing circuit 512 to the switching terminal 510. Also in the power conversion mode, but out of phase with the high-side current, low side current flows from the switching terminal, through the low-side transistor 504, through the sensing circuit 514 to the ground terminal 508. The transistors 518 and 522 can be switched with 502 and 504, respectively, or more commonly held on during power conversion modes. In the active rectification mode, high-side current flows from the switching terminal 510 through the sending circuit 512 and the transistor 502 and to the terminal 506. Also in the active rectification mode, low side current can flow from the ground terminal 508 through the sensing circuit 514, through the transistor 504 and to the switching terminal 510. Alternatively, in the rectification mode, the low-side transistor 504 can be disabled. As described above, the communication channel 536 can be used to provide control instructions to prevent shoot through at each transistor 502, 504 by ensuring active rectification has fully disabled before the opposite switching transistor 504, 502 is enabled.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be configured to couple to those components to form the described circuitry or device. For example, a structure described herein as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure, either at a time of manufacture or after a time of manufacture, such as by an end-user and/or a third-party.

Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:

a first transistor having first and second current terminals and a first control terminal;

a second transistor having third and fourth current terminals and a second control terminal, in which the third current terminal is coupled to the second current terminal;

a control circuit having a first input, a second input, and an output, the first input coupled to the second current terminal, and the output coupled to the first control terminal, the control circuit configurable to set a state of the output responsive to a state of the first input and a switching signal at the second input; and a circuit including a regulator having an input coupled to the second current terminal and configurable to regulate a voltage across the second transistor.

2. The apparatus of claim 1, wherein the regulator further comprises:

a third transistor coupled between the output of the control circuit and the second control terminal and having a third control terminal; and an error amplifier having first and second error inputs and an error output, in which the error output is coupled to the third control terminal, the first error input is coupled to the second current terminal, the second error input is coupled to a regulation reference terminal.

3. The apparatus of claim 1, wherein the control circuit includes:

a first logic circuit having first and second logic inputs and a first logic output, in which the first logic output is coupled to the output of the control circuit;

a first comparator having first and second comparator inputs and a first comparator output, in which the first comparator output is coupled to the first logic input, the first comparator input is coupled to the first input of the control circuit, and the second comparator input is coupled to a first reference voltage terminal;

a second comparator having third and fourth comparator inputs and a second comparator output, in which the second comparator output is coupled to the second logic input, the third comparator input is coupled to the first input of the control circuit, and the fourth comparator input is coupled to a second reference voltage terminal; and a second logic circuit having third and fourth logic inputs and second and third logic outputs, the fourth logic input coupled to the second input of the control circuit, in which the first logic output is coupled to the third logic input, the second logic output is coupled to the first control terminal, and the third logic output is coupled to the second control terminal; and the apparatus further comprises a power converter control circuit having a drive control output coupled to the fourth logic input via the second input of the control circuit.

4. The apparatus of claim 3, wherein the second logic circuit comprises:

a first OR-gate having first and second OR-inputs and a first OR-output, in which the first OR-input is coupled to the second input of the control circuit, the second OR-input is coupled to the first logic output, and the first OR-output is coupled to the second control terminal; and a second OR-gate having third and fourth OR-inputs and a second OR-output, in which the third OR-input is coupled to the second input of the control circuit, the fourth OR-input is coupled to the first OR-output, and the second OR-output is coupled to the first control terminal.

5. The apparatus of claim 3, wherein the second logic circuit is configurable to operate the first transistor in a power conversion mode responsive to the switching signal and to operate the first transistor in a rectification mode responsive to a voltage at the second current terminal and a reference voltage at the first reference voltage terminal.

6. The apparatus of claim 3, wherein the first comparator is configurable to turn on the first transistor to enable active rectification of current through the first transistor responsive to a voltage at the second current terminal exceeding a voltage at the first reference voltage terminal, and the second comparator is configurable to turn off the first transistor and disable the active rectification responsive to a voltage at the second current terminal falling below a voltage at the second reference voltage terminal.

7. The apparatus of claim 1, wherein the first transistor is a high-side transistor of a power converter, the second current terminal is coupled to a switching terminal of the power converter, the circuit is a first circuit, the switching signal is a first switching signal, the output is a first output, and the apparatus further comprises:

a low-side transistor having third and fourth current terminals and a second control terminal, the third current terminal is coupled to the switching terminal;

a second circuit coupled between the fourth current terminal and a ground terminal;

a second control circuit having a third input, a fourth input and a second output, the third input coupled to the fourth current terminal, the fourth input coupled to the second input, and the second output coupled to the second control terminal, the second control circuit configurable to set a state of the second output responsive to a state of the third input and a second switching signal at the fourth input.

8. The apparatus of claim 1, wherein the circuit and the control circuit are part of an integrated circuit.

9. A circuit comprising:

a first transistor having first and second current terminals and a first control terminal;

a second transistor having third and fourth current terminals and a second control terminal, in which the third current terminal is coupled to the second current terminal;

a drive circuit having a sense input and a drive output, in which the sense input is coupled to the second current terminal and the drive output is coupled to the first control terminal; and a control circuit having an input coupled to the third current terminal and an output coupled to the second control terminal.

10. The circuit of claim 9, wherein the drive circuit comprises:

a first comparator having first and second comparator inputs and a first comparator output, the first comparator input is coupled to the second current terminal, and the second comparator input is coupled to a first reference voltage terminal; and a second comparator having third and fourth comparator inputs and a second comparator output, the third comparator input is coupled to the second current terminal, and the fourth comparator input is coupled to a second reference voltage terminal; and rectification drive logic having first and second logic inputs and a drive logic output, in which the first comparator output is coupled to the first logic input, the second comparator output is coupled to the second logic input, and the drive logic output is coupled to the drive output.

11. The circuit of claim 10, wherein the control circuit includes a regulator circuit having first and second regulator inputs and a regulator output, in which the first regulator input is coupled to the second current terminal via the input of the control circuit, the second regulator input is coupled to a reference terminal, and the regulator output is coupled to the second control terminal, wherein the regulator circuit comprises:

a third transistor having fifth and sixth current terminals and a third control terminal, in which the fifth current terminal is coupled to the drive logic output, the sixth current terminal is coupled to the second control terminal; and an error amplifier having first and second error inputs and an error output, in which the error output is coupled to the third control terminal, the first error input is coupled to the second current terminal, and the second error input is coupled to the reference terminal.

12. The circuit of claim 9, wherein the circuit further comprises:

switching logic having first and second logic inputs and first and second logic outputs, in which the drive output is coupled to the first logic input, the first logic output is coupled to the first control terminal, and the second logic output is coupled to the second control terminal; and a power converter control circuit having a drive control output coupled to second logic input and configurable to provide a drive logic signal at the drive control output.

13. The circuit of claim 12, wherein the switching logic comprises:

a first OR-gate having first and second OR-inputs and a first OR-output, in which the first OR-input is coupled to the drive control output, the second OR-input is coupled to the drive output, and the first OR-output is coupled to the second control terminal; and a second OR-gate having third and fourth OR-inputs and a second OR-output, in which the third OR-input is coupled to the drive control output, the fourth OR-input is coupled to the first OR-output, and the second OR-output is coupled to the first control terminal.

14. The circuit of claim 12, wherein:

the switching logic is configurable to operate the first and second transistors in a power conversion mode as part of a power converter responsive to the drive logic signal, and the drive circuit is configurable to operate the first and second transistors in a rectification mode responsive to a voltage at the second current terminal and at least one reference voltage.

15. The circuit of claim 11, wherein the regulator circuit is configurable to regulate a voltage across the second transistor.

16. The circuit of claim 9, wherein the first transistor is a high-side transistor of a power converter circuit, the drive circuit is a first drive circuit, and the circuit further comprises:

a low-side transistor having fifth and sixth current terminals and a third control terminal, in which in which the fifth current terminal and the fourth current terminal are coupled to a switching terminal of the power converter circuit;

a third transistor coupled in series with the low-side transistor between the sixth current terminal and a ground terminal; and a second drive circuit having a second sense input and a second drive output, in which the second sense input is coupled to the fourth current terminal, and the drive output is coupled to the third control terminal.

17. A circuit comprising:

a transistor having a first current terminal and a second current terminal;

a device coupled to the second current terminal; and a drive circuit configurable to operate the transistor in a rectification mode responsive to a voltage at the second current terminal and at least one reference voltage, in which the transistor is operable to, in the rectification mode, conduct a current from the second current terminal to the first current terminal.

18. The circuit of claim 17, wherein the at least one reference voltage is a turn-on reference voltage, and the drive circuit comprises:

a first comparator configurable to provide a first comparator signal responsive to the voltage at the first or second current terminals and the turn-on reference voltage; and a second comparator configurable to provide a second comparator signal based on the voltage at the first or second current terminals and a turn-off reference voltage; and a rectification drive logic circuit configurable to provide a rectification control signal to drive the transistor in the rectification mode based on the first comparator signal and to deactivate the transistor based on the second comparator signal.

19. The circuit of claim 18, wherein the transistor is a first transistor, the device includes a second transistor, and the circuit further comprising:

a power converter control circuit configurable to provide a drive control signal; and a switching logic circuit configurable to operate the first and second transistors in a switching mode, as part of a power converter, responsive to the drive control signal and to operate the first and second transistors in the rectification mode responsive to the rectification control signal.

20. The circuit of claim 19, wherein the switching logic circuit comprises:

a first OR-gate configurable to provide a first logic signal based on the drive control signal and the rectification control signal; and a second OR-gate configurable to provide a second logic signal based on the drive control signal and the first logic signal, in which the first transistor is activated based on the second logic signal the second transistor is activated based on the first logic signal.

21. The circuit of claim 17, wherein the transistor is a first transistor, the device is a second transistor, and the circuit further comprises a regulator circuit configurable to regulate a voltage across the second transistor based on a first reference voltage and a voltage at the second current terminal, wherein the regulator circuit comprises:

a third transistor coupled between an output of the drive circuit and a control terminal of the second transistor; and an error amplifier configurable to provide an error signal at the control terminal responsive to the voltage at the first or second current terminals and an error reference voltage.

22. The circuit of claim 17, wherein the transistor is a high-side transistor of a power converter circuit, the drive circuit is a first drive circuit, the high-side transistor and the device are coupled between a voltage terminal and a switching terminal of the power converter circuit, and the circuit further comprises:

a low-side transistor having a third current terminal;

a third transistor having a fourth current terminal coupled to the third current terminal, the low-side transistor and the third transistor coupled in series between the switching terminal and a ground terminal; and a second drive configurable to operate the low-side transistor and the third transistor in a respective rectification mode responsive to a voltage at the third or fourth current terminals and at least one reference voltage.

* * * * *